United States Patent
Song et al.

(10) Patent No.: US 8,896,018 B2
(45) Date of Patent: Nov. 25, 2014

(54) VACUUM TRAY AND METHOD OF MANUFACTURING LIGHT EMITTING DEVICE USING THE SAME

(75) Inventors: Jong Sup Song, Gyeonggi-do (KR); Tae Gyu Kim, Gyeonggi-do (KR); Jae Sung You, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 206 days.

(21) Appl. No.: 13/483,768

(22) Filed: May 30, 2012

(65) Prior Publication Data

US 2012/0309119 A1    Dec. 6, 2012

(30) Foreign Application Priority Data

May 30, 2011 (KR) .................. 10-2011-0051457

(51) Int. Cl.
*H01L 33/00* (2010.01)
*B25B 11/00* (2006.01)
*H01L 33/50* (2010.01)

(52) U.S. Cl.
CPC ............ *H01L 33/505* (2013.01); *B25B 11/005* (2013.01); *H01L 2933/0041* (2013.01)
USPC ............................................ 257/100; 257/79

(58) Field of Classification Search
USPC .................................................. 257/79, 100
See application file for complete search history.

(56) References Cited

U.S. PATENT DOCUMENTS

2008/0224162 A1 * 9/2008 Min et al. ............... 257/98

FOREIGN PATENT DOCUMENTS

| JP | 2009-142992 | 7/2009 |
| KR | 10-2007-0032426 A | 3/2007 |
| KR | 10-2008-0040778 A | 5/2008 |
| KR | 10-2008-0083377 A | 9/2008 |
| KR | 10-2009-0076101 A | 7/2009 |
| KR | 10-2010-0077517 A | 7/2010 |
| KR | 10-2010-0102836 A | 9/2010 |

\* cited by examiner

*Primary Examiner* — Jae Lee
(74) *Attorney, Agent, or Firm* — McDermott Will & Emery LLP (57) ABSTRACT

There is provided a vacuum tray including a pocket part; a seating part being stepped downwardly from a bottom surface of the pocket part and having a light emitting device seated therein; and a cavity part being stepped downwardly from edges of the seating part and having an electrode terminal of the light emitting device accommodated therein. The pocket part may include a plurality of pocket parts having a matrix structure, such that the plurality of pocket parts are arranged in columns and rows.

14 Claims, 8 Drawing Sheets

VACUUM TRAY AND METHOD OF MANUFACTURING LIGHT EMITTING DEVICE USING THE SAME

CROSS-REFERENCE TO RELATED APPLICATIONS

This application claims the priority of Korean Patent Application No. 10-2011-0051457 filed on May 30, 2011, in the Korean Intellectual Property Office, the disclosure of which is incorporated herein by reference.

BACKGROUND OF THE INVENTION

1. Field of the Invention

The present invention relates to a vacuum tray and a method of manufacturing a light emitting device using the same.

2. Description of the Related Art

In recent years, various electronic devices, as well as mobile communications devices such as a personal mobile phone, a personal digital assistant (PDA) and the like, have used a light emitting diode (LED), emitting light according to electrical signals, as a light source.

LEDs, a type of light emitting devices, are capable of producing light of various colors by altering semiconductor compounds such as GaAs, AlGaAs, GaN, InGaP, and the like.

LEDs may emit red light, blue light, green light or ultraviolet light according to compounds contained therein. White light may be produced by combining red light, blue light, and green light emitted from the respective LEDs. However, such a method of producing white light requires the use of a plurality of LEDs and difficulties in color uniformity may occur.

Accordingly, a phosphor material for a wavelength conversion of light is generally mixed with a resin such as silicon or the like and a mixture thereof is applied to form a white LED. Due to the mixture, blue light or ultraviolet light emitted from the LED is converted into white light, and thus monochromatic white light may be produced.

However, such a method of mixing the phosphor material with the resin and applying the mixture thereof has a problem in that the thickness of a phosphor layer formed on a surface of the LED may be uneven. In particular, in the case of LEDs manufactured on a mass production basis, the requirements for the distribution of the thickness of the phosphor layer may not be satisfied.

SUMMARY OF THE INVENTION

An aspect of the present invention provides a vacuum tray satisfying requirements for the distribution of the thickness of a phosphor layer formed on a surface of a light emitting device when manufactured on a mass production basis and a method of manufacturing a light emitting device using the same.

According to an aspect of the present invention, there is provided a vacuum tray including: a pocket part; a seating part stepped downwardly from a bottom surface of the pocket part and having a light emitting device seated therein; and a cavity part stepped downwardly from edges of the seating part and having an electrode terminal of the light emitting device accommodated therein.

The pocket part may include a plurality of pocket parts having a matrix structure such that the plurality of pocket parts are arranged in columns and rows.

The vacuum tray may further include a vacuum hole provided in a bottom surface of the cavity part and communicating with the cavity part.

The pocket part may have internal side surfaces inclined toward the light emitting device such that an area defined by upper edges of the pocket part is wider than that of the bottom surface of the pocket part.

The pocket part may have an upper edge disposed to be higher than an upper surface of the light emitting device.

The seating part may include a vertical surface contacting a side surface of the light emitting device and a flat surface extending from the vertical surface in a horizontal manner and contacting a lower surface of the light emitting device, and the seating part may have a shape corresponding to that of the light emitting device.

The seating part may further include a sealing member provided on the flat surface.

Intervals between upper edges of the pocket parts and seating parts provided within the corresponding pocket parts may be consistent.

The pocket part may include at least one seating part and at least one cavity part therein.

According to another aspect of the present invention, there is provided a method of manufacturing a light emitting device, the method including: preparing a vacuum tray including a pocket part, a seating part stepped downwardly from a bottom surface of the pocket part and having a light emitting device seated therein, and a cavity part stepped downwardly from edges of the seating part and having an electrode terminal of the light emitting device accommodated therein; mounting the light emitting device in the seating part within the pocket part such that the electrode terminal formed on a lower surface of the light emitting device is accommodated in the cavity part; forming a phosphor layer by filling the pocket part with a resin containing a phosphor material while covering the light emitting device; and separating the light emitting device having the phosphor layer formed thereon from the pocket part of the vacuum tray.

The pocket part may include a plurality of pocket parts having a matrix structure such that the plurality of pocket parts are arranged in columns and rows.

The mounting of the light emitting device may include fixing the light emitting device to the seating part using a vacuum hole communicating with the cavity part.

The forming of the phosphor layer may include providing the resin to the pocket part to be even with an upper surface of the vacuum tray to thereby obtain planarization; and hardening the resin.

The planarization may be performed by removing an excess amount of the resin protruded upwardly from the upper surface of the vacuum tray from the pocket part using a squeegee.

The method may further include polishing an upper surface of the phosphor layer being hardened.

BRIEF DESCRIPTION OF THE DRAWINGS

The above and other aspects, features and other advantages of the present invention will be more clearly understood from the following detailed description taken in conjunction with the accompanying drawings, in which:

FIGS. 5A through 10 are schematic views illustrating a method of manufacturing a light emitting device according to an embodiment of the present invention.

DETAILED DESCRIPTION OF THE INVENTION

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

A vacuum tray according to an embodiment of the present invention will be described with reference to FIGS. 1A through 3.

Figure 1A:
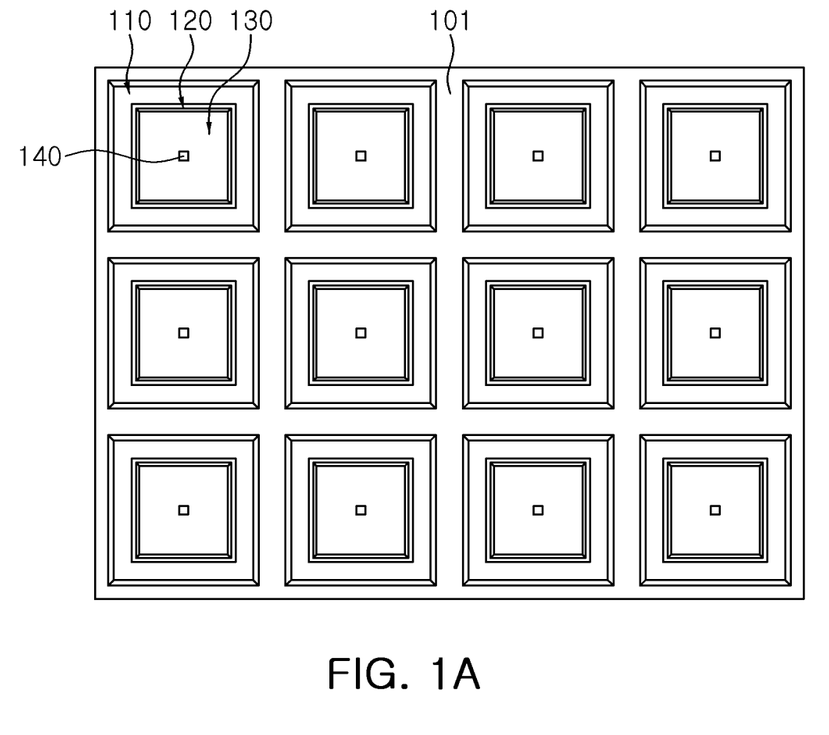
FIGS. 1A and 1B are schematic views of a vacuum tray according to an embodiment of the present invention.
Figure 1B:
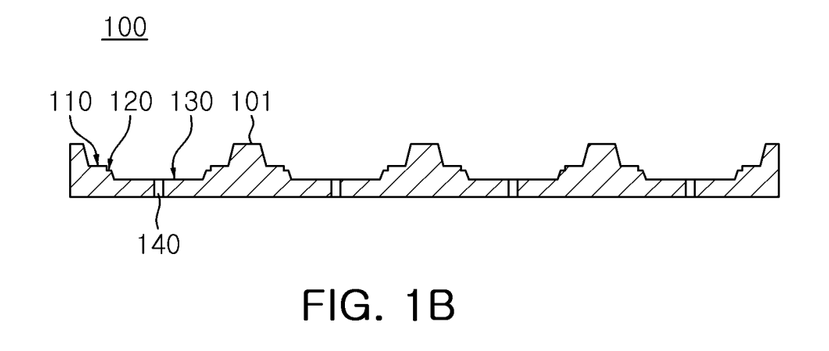
Figure 2:
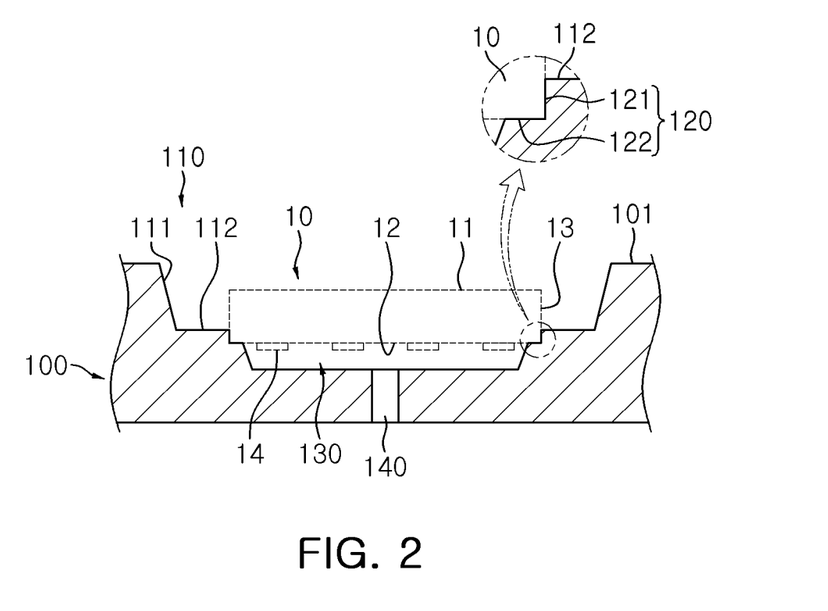
FIG. 2 is a schematic view of a pocket part in the vacuum tray of FIGS. 1A and 1B.
Figure 3A:
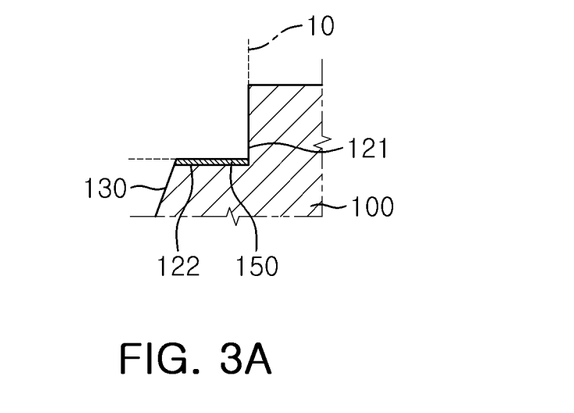
FIGS. 3A and 3B are schematic views of a seating part of FIG. 2.
Figure 3B:
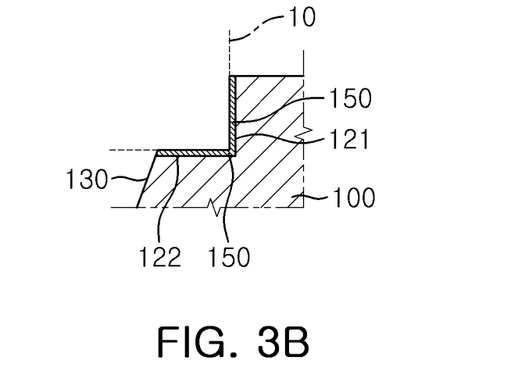

FIGS. 1A and 1B are schematic views of a vacuum tray according to an embodiment of the present invention; FIG. 2 is a schematic view of a pocket part in the vacuum tray of FIGS. 1A and 1B; and FIGS. 3A and 3B are schematic views of a seating part of FIG. 2.

With reference to FIGS. 1A and 1B, a vacuum tray according to an embodiment of the present invention may be a metallic plate structure and include a plurality of pocket parts 110, and seating parts 120 and cavity parts 130 provided within the individual pocket parts 110.

The plurality of pocket parts 110 may be recessed in a surface of the vacuum tray 100 as shown in FIGS. 1A and 1B and may have a matrix structure in which the plurality of pocket parts 110 are arranged in columns and rows.

The pocket part 110 is a space within the vacuum tray 100 for accommodating a light emitting device 10. An area defined by upper edges of the pocket part 110 is wider than that of a bottom surface 112 thereof on which the light emitting device 10 is seated, such that the pocket part 110 has an inverted pyramid structure in which an internal side surface 111 thereof is inclined toward the light emitting device 10.

The pocket part 110 has a depth greater than the thickness of the light emitting device 10 such that the upper edge of the pocket part 110 is disposed to be higher than an upper surface 11 of the light emitting device 10 disposed within the pocket part 110. Specifically, in a case in which the light emitting device 10 is mounted on the bottom surface 112 of the packet part 110, the upper surface 11 of the light emitting device 10 is not exposed above the upper edge of the packet part 110.

A space between the light emitting device 10 mounted on the bottom surface 112 of the pocket part 110 and the internal side surface 111 of the pocket part 110 and a space between the upper surface 11 of the light emitting device 10 and the upper edge of the pocket part 110 define the thickness of a phosphor layer 20. Specifically, when a resin for the phosphor layer 20 is injected in a state in which the light emitting device 10 is mounted within the pocket part 110, the resin fills the space between the light emitting device 10 and the pocket part 110, thereby forming the phosphor layer 20. Therefore, the thickness of the phosphor layer 20 may be adjusted by altering the depth of the pocket part 110, a distance between the internal side surface 111 and the light emitting device 10, and the like.

The seating part 120 is stepped by being recessed downwardly from the bottom surface 112 of the pocket part 110 and has the light emitting device 10 seated therein.

As shown in FIG. 2, the seating part 120 includes a vertical surface 121 contacting a side surface 13 of the light emitting device 10 and a flat surface 122 extending from the vertical surface 121 in a horizontal manner and contacting a lower surface 12 of the light emitting device 10. The seating part 120 has a shape corresponding to that of the light emitting device 10. Therefore, in a case in which the light emitting device 10 is seated on the seating part 120, edge portions of the lower surface 12 of the light emitting device 10 and the individual side surfaces 13 adjacent thereto contact the flat surface 122 and the vertical surface 121, respectively, and are supported thereby.

The seating part 120 is parallel to the upper edge of the pocket part 110. When the light emitting device 10 is seated in the seating part 120, the upper surface 11 of the light emitting device 10 is parallel to an upper surface 101 of the vacuum tray 100. An interval (i.e., depth) between the upper edge of the pocket part 110 and the seating part 120 is consistent. In particular, in a case in which the plurality of pocket parts 110 are formed, intervals between the upper edges of the individual pocket parts 110 and the seating parts 120 provided within the corresponding pocket parts 110 are entirely consistent.

The seating part 120 may include a sealing member 150, formed of an insulating material such as an o-ring, on the flat surface 122 as shown in FIG. 3A. When the light emitting device 10 is mounted in the seating part 120, the sealing member 150 may act as a buffer to protect the light emitting device 10 and prevent a gap between the seating part 120 and the light emitting device 10.

The sealing member 150 may be provided on the flat surface 122, and may be also provided on the vertical surface 121 as shown in FIG. 3B.

The cavity part 130 is stepped by being recessed downwardly from edges of the seating part 120 and accommodates an electrode terminal 14 of the light emitting device 10. The light emitting device 10 may be a bare chip having the electrode terminal 14 formed on the lower surface 12. Although not shown, a solder bump may be further provided on the electrode terminal 14.

As shown in FIG. 2, the cavity part 130 is stepped downwardly from edges of the seating part 120, that is, edges of the flat surface 122. The cavity part 130 may have a depth greater than a protruding height of the electrode terminal 14 such that the cavity part 130 accommodates the electrode terminal 14 formed on the lower surface 12 of the light emitting device 10 therein.

Therefore, in a case in which the light emitting device 10 is mounted within the pocket part 110, the light emitting device 10 is seated in the seating part 120 while being supported and fixed thereby, the electrode terminal 14 of the light emitting device 10 is accommodated within the cavity part 130 without contact between the electrode terminal 14 and the vacuum tray 100. This structure allows the light emitting device 10 to be mounted within the pocket part 110 while being fixedly supported by the seating part 120.

Meanwhile, a vacuum hole 140 may be formed in the bottom surface of the cavity part 130 to communicate with the cavity part 130. The vacuum hole 140 is coupled to an external vacuum pump (not shown), whereby the light emitting device 10 is firmly fixed to the seating part 120 within the pocket part 110 through vacuum suction so as not to be easily separated from the seating part 120.

The single vacuum hole 140 is formed in the individual cavity parts 130; however, the invention is not limited thereto. The number of the vacuum hole 140 may be varied.

Hereinafter, a vacuum tray according to another embodiment of the invention will be described with reference to FIG. 4.

Figure 4:
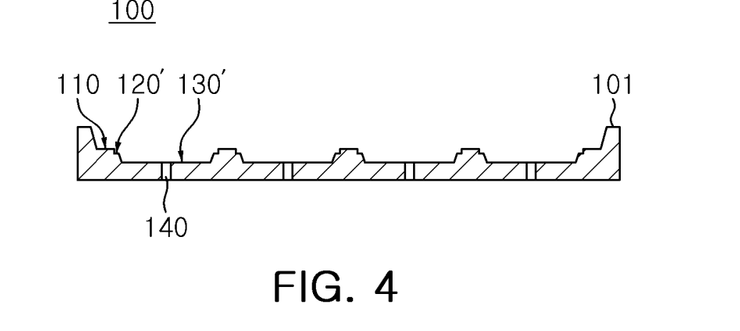
FIG. 4 is a schematic view of a vacuum tray according to another embodiment of the present invention.

The vacuum tray according to the embodiment of FIG. 4 has substantially the same basic structure as that of the vacuum tray according to the embodiment of FIGS. 1A through 3. Since a seating part and a cavity part in this embodiment have different structures to those of the embodiment of FIGS. 1A through 3, a detailed description thereof will be provided with omissions of descriptions of the same structure.

FIG. 4 is a schematic view of a vacuum tray according to another embodiment of the present invention.

As shown in FIG. 4, each of the pocket parts 110 includes a plurality of seating parts 120' and a plurality of cavity parts 130' formed on the bottom surface 112 thereof. That is, contrary to the case of FIG. 1 in which the single seating part 120 is formed within the individual pocket parts 110, the plurality of seating parts 120' and the plurality of cavity parts 130' may be formed within each of the pocket parts 110. Therefore, the plurality of light emitting devices 10 may be mounted within the single pocket part 110.

Intervals between the plurality of seating parts 120' and the upper edge of the pocket part 110 may be consistent. Accordingly, intervals between the upper surfaces of the individual light emitting devices 10 seated in the individual seating parts 120' and the upper edge of the pocket part 110 may be consistent.

In a case in which the plurality of light emitting devices 10 are mounted within the pocket part 110, the pocket part 110 is filled with a resin to thereby form a phosphor layer. In this case, the phosphor layer is integrally formed with respect to the plurality of light emitting devices 10, whereby mass production may be facilitated. In addition, a multichip formed of the plurality of light emitting devices may be manufactured. In particular, the thickness of the phosphor layer formed on the individual light emitting devices is consistent, so that a plurality of light emitting devices having the same light characteristics may be manufactured at the same time.

With reference to FIGS. 5A through 10, a method of manufacturing a light emitting device according to an embodiment of the invention will be described below. FIGS. 5A through 10 are schematic views illustrating individual operations included in a method of manufacturing a light emitting device according to an embodiment of the invention.

First of all, the vacuum tray 100 for the mounting of the light emitting devices 10 as shown in FIGS. 1A through 4 is prepared.

The vacuum tray 100 includes the plurality of pocket parts 110, in which the respective light emitting devices 10 are mounted, and has a matrix structure in which the plurality of pocket parts 110 are arranged in columns and rows.

Each pocket part 110 includes the seating part 120 being stepped by being downwardly recessed from the bottom surface of the pocket part 110 and allowing the light emitting device 10 to be seated therein. Further, the cavity part 130 is provided to be stepped by being downwardly recessed from the edges of the bottom surface of the seating part 120, and the electrode terminal 14 of the light emitting device 10 is accommodated within the cavity part 130.

Meanwhile, the vacuum hole 140 may be formed in the bottom surface of the cavity part 130 to communicate with the cavity part 130. The vacuum hole 140 is coupled to an external vacuum pump (not shown), whereby the light emitting device 10 is firmly fixed to the seating part 120 within the pocket part 110 through vacuum suction so as not to be easily separated from the seating part 120.

Figure 5A:
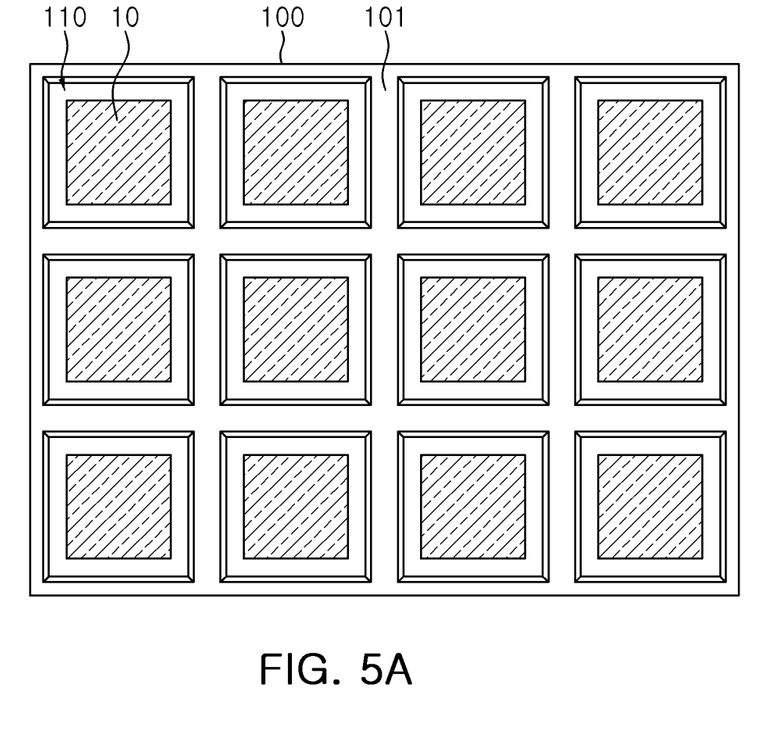
Figure 5B:
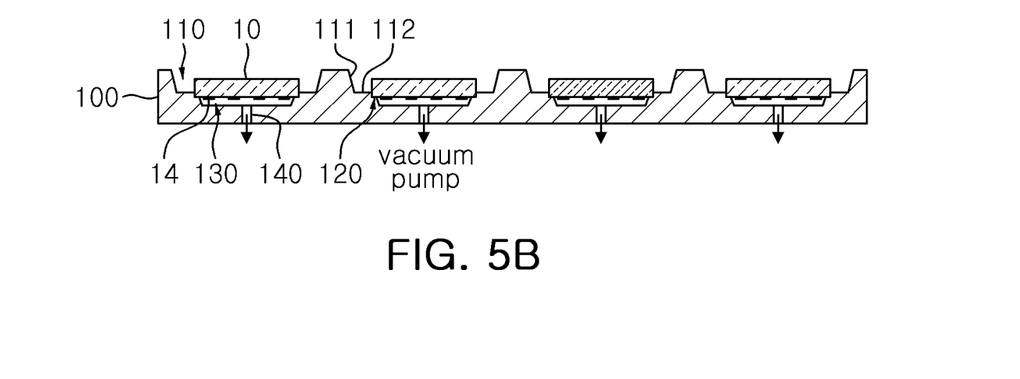

Next, as shown in FIGS. 5A and 5B, the light emitting devices 10 are respectively mounted in the seating parts 120 within the individual pocket parts 110 while allowing the electrode terminals 14 formed on the lower surfaces 12 of the light emitting devices 10 to be accommodated within the cavity parts 130. The light emitting device 10 may be a bare chip having the electrode terminal 14 formed on the lower surface 12 while the phosphor layer 20 is not yet formed on a surface thereof. Each pocket part 110 may have a single light emitting device or a plurality of light emitting devices mounted therein.

Figure 6:
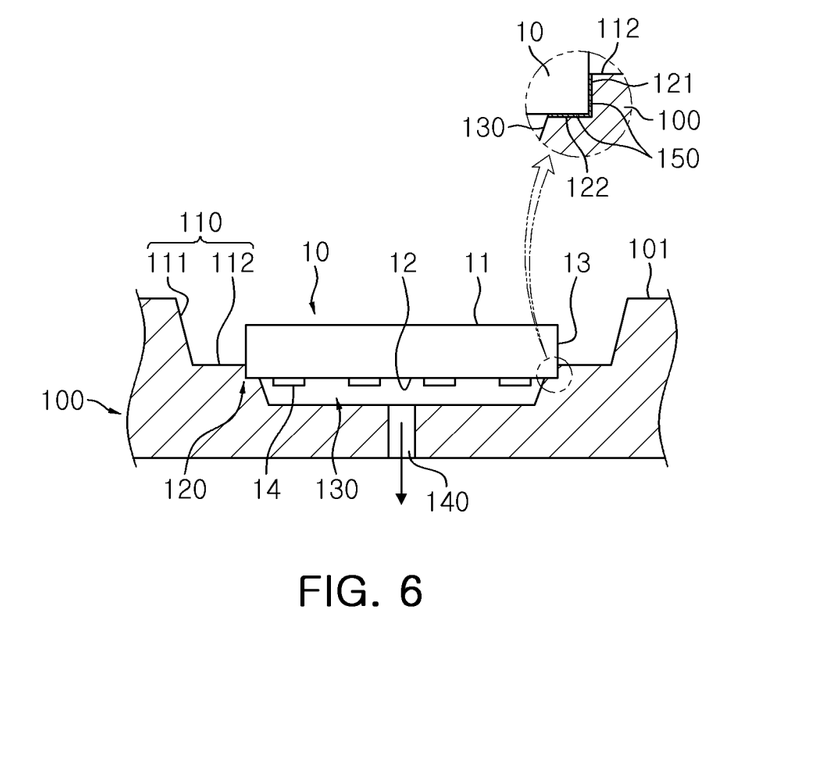

As shown in FIG. 6, in order to prevent the light emitting device 10 from being separated from the seating part 120, the vacuum hole 140 communicating with the cavity part 130 is provided to fix the light emitting device 10 to the seating part 120. In this manner, the light emitting device 10 may be stably fixed while maintaining a horizontal state within the pocket part 110 during the manufacturing thereof.

The vacuum hole 140 may be coupled to a vacuum pump (not shown) to thereby allow for the fixation of the light emitting device 10 through vacuum suction generated by the operation of the vacuum pump. In a case in which the light emitting device 10 is seated in the seating part 120, the cavity part 130 may be airtight. To enable this, the sealing member 150 formed of an insulating material may be provided on the seating part 120. When the light emitting device 10 is mounted in the seating part 120, the sealing member 150 may act as a buffer to protect the light emitting device 10 and prevent a gap between the seating part 120 and the light emitting device 10.

Figure 7A:
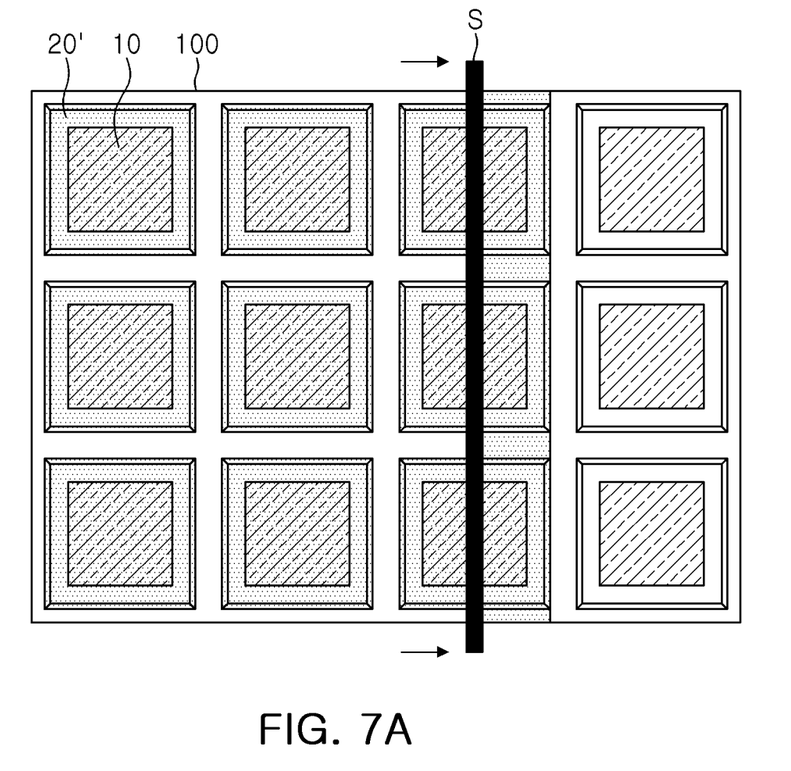
Figure 7B:
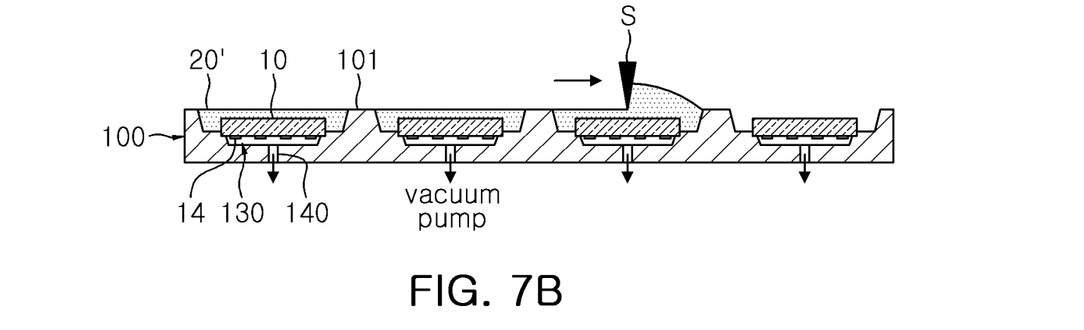
Figure 8:
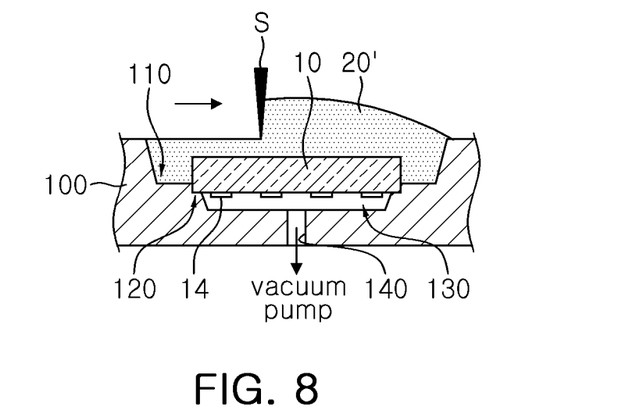

Next, as shown in FIGS. 7A through 8, the individual pocket parts 110 are filled with a resin 20' containing a phosphor material to cover the light emitting devices 10, thereby forming the phosphor layer 20.

As shown in FIGS. 7A and 7B, a certain amount of the resin 20' containing the phosphor material is applied to the upper surface 101 of the vacuum tray 100 using a dispenser (not shown) or the like. The amount of the resin 20' may be sufficient to fill the entirety of the plurality of pocket parts 110 formed in the vacuum tray 100.

In a state in which the resin 20' is applied to the pocket parts 110, the resin 20' may be spread from one end of the vacuum tray 100 towards the other end thereof using a squeegee S or the like, and thus, the individual pocket parts 110 may be filled with the resin 20' applied to the upper surface 101 of the vacuum tray 100 in a printing scheme.

As shown in FIG. 8, an excess amount of the resin 20' protruded upwardly from the upper surface 101 of the vacuum tray 100 is removed from the individual pocket parts 110 using the squeegee S or the like, such that the resin 20' filling the individual pocket parts 110 may be even with the upper surface 101 of the vacuum tray 100 to obtain planarization.

Then, the resin 20' is hardened to thereby form the phosphor layer 20. Therefore, the phosphor layer 20 formed within the individual pocket parts 110 may have the same height.

As described above, the plurality of pocket parts 110 may be filled with the resin 20' containing the phosphor material by a single printing process, whereby manufacturing time may be reduced. In addition, the phosphor layer having the same height may be formed.

The phosphor layer 20 converts a wavelength of light emitted from the light emitting device 10 to a wavelength of light having a desired color. For example, the phosphor layer 20 may convert monochromatic light such as red light or blue light to white light. To enable this, the resin for the phosphor layer 20 may contain at least one phosphor material. In addition, an ultraviolet absorbent may be further included therein in order to absorb ultraviolet rays emitted from the light emitting device 10.

The phosphor layer 20 may be formed within the pocket parts 110 by the filling and hardening of the resin 20'. The resin 20' for the phosphor layer 20 may be a resin having high transparency allowing light produced in the light emitting device 10 to pass therethrough while minimizing light loss. For example, an elastic resin may be used therefor. An elastic resin is a gel-type resin such as silicon or the like and has superior optical characteristics since it is minimally affected by yellowing caused by short wavelength light or the like, and has high refractivity. Unlike an epoxy resin, the elastic resin may maintain a gel or elastomer state even after the hardening thereof, such that it may allow the light emitting device to be more stable with regard to thermal stress, vibrations, external impacts or the like. Also, since the phosphor layer 20 is hardened after the pocket parts 110 are filled therewith in a liquid state, during the hardening process, bubbles therein may be exposed to the air and move outwardly.

Figure 9:
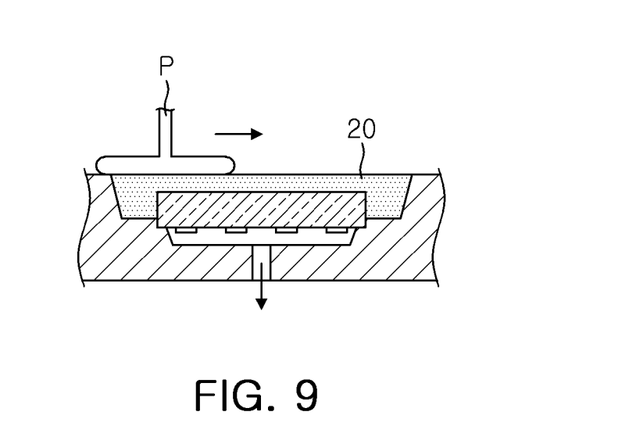

Then, as shown in FIG. 9, an upper surface of the hardened phosphor layer 20 and the upper surface 101 of the vacuum tray 100 are both polished by a polishing device P or the like. Accordingly, the hardened resin remaining on a portion of the upper surface 101 of the vacuum tray 100 may be completely removed therefrom.

Figure 10:
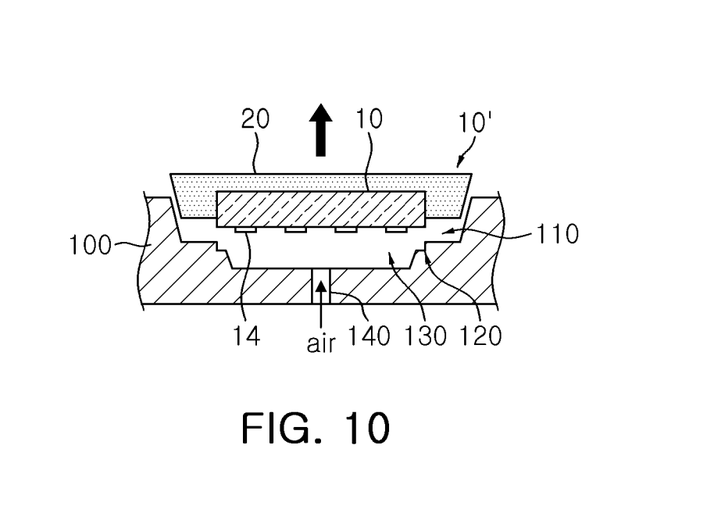

Then, as shown in FIG. 10, the light emitting devices 10 are separated from the individual pocket parts 110 of the vacuum tray 100, thereby achieving mass production of light emitting devices 10', each of which has the phosphor layer 20 formed on a surface thereof.

In the mass-produced plurality of light emitting devices 10', the thickness of the phosphor layer is uniform, such that the requirements for the distribution of the thickness of the phosphor layer may be satisfied. Therefore, defective rates may be minimized and improved productivity may be achieved.

Figure 11:
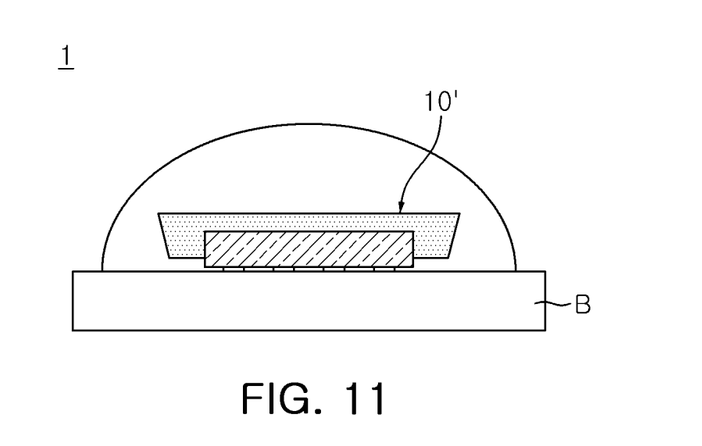
FIG. 11 is a schematic view of a lighting module including a light emitting device manufactured according to an embodiment of the present invention.

As shown in FIG. 11, a lighting module 1 may be manufactured by mounting the light emitting device 10' having the phosphor layer 20 formed thereon on a substrate B in a flip-chip bonding scheme. In this case, a separate phosphor application process or the like is not required, whereby manufacturing process is simplified and production costs may be reduced.

As set forth above, a vacuum tray according to embodiments of the invention satisfies requirements for the distribution of the thickness of a phosphor layer formed on a surface of a light emitting device when manufactured on a mass production basis.

While the present invention has been shown and described in connection with the embodiments, it will be apparent to those skilled in the art that modifications and variations can be made without departing from the spirit and scope of the invention as defined by the appended claims.

What is claimed is:

1. A vacuum tray, comprising:
    a pocket part;
    a seating part stepped downwardly from a bottom surface of the pocket part and having a light emitting device seated therein;
    a cavity part stepped downwardly from edges of the seating part and having an electrode terminal of the light emitting device accommodated therein; and
    a vacuum hole provided in a bottom surface of the cavity part and communicating with the cavity part.

2. The vacuum tray of claim 1, wherein the pocket part comprises a plurality of pocket parts having a matrix structure such that the plurality of pocket parts are arranged in columns and rows.

3. The vacuum tray of claim 1, wherein the pocket part has internal side surfaces inclined toward the light emitting device such that an area defined by upper edges of the pocket part is wider than that of the bottom surface of the pocket part.

4. The vacuum tray of claim 1, wherein the pocket part has an upper edge disposed to be higher than an upper surface of the light emitting device.

5. A vacuum tray, comprising:
    a pocket part:
    a seating part stepped downwardly from a bottom surface of the pocket part and having a light emitting device seated therein; and
    a cavity part stepped downwardly from edges of the seating part and having an electrode terminal of the light emitting device accommodated therein, wherein:
    the seating part includes a vertical surface contacting a side surface of the light emitting device and a flat surface extending from the vertical surface in a horizontal manner and contacting a lower surface of the light emitting device, and
    the seating part has a shape corresponding to that of the light emitting device.

6. The vacuum tray of claim 5, wherein the seating part further includes a sealing member provided on the flat surface.

7. The vacuum tray of claim 2, wherein intervals between upper edges of the pocket parts and seating parts provided within the corresponding pocket parts are consistent.

8. The vacuum tray of claim 1, wherein the pocket part includes at least one seating part and at least one cavity part therein.

9. A method of manufacturing a light emitting device, the method comprising:
    preparing a vacuum tray including a pocket part, a seating part stepped downwardly from a bottom surface of the pocket part and having a light emitting device seated therein, and a cavity part stepped downwardly from edges of the seating part and having an electrode terminal of the light emitting device accommodated therein;
    mounting the light emitting device in the seating part within the pocket part such that the electrode terminal formed on a lower surface of the light emitting device is accommodated in the cavity part;
    forming a phosphor layer by filling the pocket part with a resin containing a phosphor material while covering the light emitting device; and
    separating the light emitting device having the phosphor layer formed thereon from the pocket part of the vacuum tray.

10. The method of claim 9, wherein the pocket part comprises a plurality of pocket parts having a matrix structure such that the plurality of pocket parts are arranged in columns and rows.

11. The method of claim 9, wherein the mounting of the light emitting device includes fixing the light emitting device to the seating part using a vacuum hole communicating the cavity part.

12. The method of claim 9, wherein the forming of the phosphor layer includes:
   providing the resin to the pocket part to be even with an upper surface of the vacuum tray to thereby obtain planarization; and
   hardening the resin.

13. The method of claim 12, wherein the planarization is performed by removing an excess amount of the resin protruded upwardly from the upper surface of the vacuum tray from the pocket part using a squeegee.

14. The method of claim 12, further comprising polishing an upper surface of the phosphor layer being hardened.

* * * * *